United States Patent
Hsu

(10) Patent No.: US 6,734,722 B1
(45) Date of Patent: May 11, 2004

(54) METHOD FOR REDUCING AREA IN CONTINUOUS-TIME FILTER FOR LOW FREQUENCY APPLICATIONS

(75) Inventor: Tse-Hsiang Hsu, Hsin-Chu (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/248,935

(22) Filed: Mar. 4, 2003

(51) Int. Cl.[7] .................................................. G06G 7/12
(52) U.S. Cl. .......................................... 327/563; 327/65
(58) Field of Search ................................ 325/551, 552, 325/63, 65, 66, 563; 330/252, 253

(56) References Cited

U.S. PATENT DOCUMENTS 5,912,583 A  6/1999  Pierson et al.

*Primary Examiner*—Kenneth B Wells
(74) *Attorney, Agent, or Firm*—Winston Hsu

(57) ABSTRACT

A transconductor includes a first transistor having a first electrode electrically coupled to a first node, a control electrode electrically coupled to a first input voltage, and a second electrode connected to a third node; a second transistor having a first electrode electrically coupled to the first node, a control electrode electrically coupled to the first input voltage, and a second electrode connected to a fourth node; a third transistor having a first electrode electrically coupled to a second node, a control electrode electrically coupled to a second input voltage, and a second electrode connected to the fourth node; and a fourth transistor having a first electrode electrically coupled to the second node, a control electrode electrically coupled to the second input voltage, and a second electrode connected to the third node. Transconductance of the transconductor can be adjusted by changing relative widths of the first through fourth transistors.

19 Claims, 7 Drawing Sheets

METHOD FOR REDUCING AREA IN CONTINUOUS-TIME FILTER FOR LOW FREQUENCY APPLICATIONS

BACKGROUND OF INVENTION

1. Field of the Invention

The present invention relates to a continuous-time filter, and more specifically, to a method of reducing area of a transconductor-capacitor (gm-C) filter.

2. Description of the Prior Art

A transconductor is a circuit that has a voltage as an input and a current as an output. Filters using transconductors and capacitors are often called gm-C filters, where gm represents a transconductance of the transconductor and C represents a capacitance of the capacitor.

Please refer to FIG. 1. FIG. 1 is a block diagram of a gm-C filter unit 10 according to the prior art. The gm-C filter unit 10 comprises a transconductor 20 with a transconductance of gm1, a current summation unit 14, and an integration capacitor C1. A positive input voltage VIP and a negative input voltage VIN are inputted to the gm-C filter unit 10.

The difference between the two input voltages VIP and VIN can be defined as Vin, where Vin=VIP−VIN. Likewise, a positive output voltage VOP and a negative output voltage VON are output from the current summation unit 14. The difference between the two output voltages VOP and VON can be defined as Vout, where Vout=VOP−VON. A ratio between Vout and Vin is directly proportional to the transconductance gm1 of the transconductor 20 and inversely proportional to a capacitance C of the capacitor, as shown in Eqn.1 below.

$$\frac{Vout}{Vin} \propto \frac{gm1}{C} \quad (1)$$

Therefore, if the ratio of Vout to Vin is to be lowered, the transconductance gm1 of the transconductor 20 can be lowered, or the capacitance C of the capacitor C1 can be raised. Unfortunately, it is difficult to give the transconductor 20 a very low transconductance value gm1.

Please refer to FIG. 2A. FIG. 2A is a circuit diagram of the conventional transconductor 20 formed with NMOS transistors according to the prior art. The transconductor 20 contains first and second current sources 22 and 24, which provide current to the transconductor 20 at nodes A and B, respectively. The transconductor 20 also contains a differential pair of transistors N1 and N2. Gates of transistors N1 and N2 are controlled by VIP and VIN, respectively. The source of transistor N1 is connected to current source 22 at node A and the source of transistor N2 is connected to current source 24 at node B. A negative output current IN flows from a drain of transistor N1 at node C and a positive output current IP flows from a drain of transistor N2 at node D. Since transistors N1 and N2 have the same properties, transistors N1 and N2 are formed having identical width-to-length ratios, which can be represented as W/L.

The transconductor 20 further comprises a control transistor N3 connected between the source of transistor N1 at node A and the source of transistor N2 at node B. The control transistor N3 has a gate controlled by a control voltage VCTL. As is well known in the art, parasitic capacitors CP1 and CP2 inherently exist on the transconductor 20, and create an excess positive phase on the negative and positive output currents IN and IP output from the transconductor 20.

In addition, an input capacitance is also associated with the transconductor 20, and is a property of all transconductors.

Please refer to FIG. 2B. FIG. 2B is a circuit diagram showing current values in the transconductor 20 of FIG. 2A. Current I flows through the first current source 22 from node A to ground and also travels through the second current source 24 from node B to ground. For simple current analysis, control transistor N3 can be modeled as a resistor with a current I2 flowing from node A to node B. Therefore, a current of I+I2 flows through transistor N1 from node C to node A. On the other hand, a current of I-I2 flows through transistor N2 from node D to node B. The transconductance of the transconductor 20 will be defined as gmx. An equation for calculating the transconductance gmx is shown in Eqn.2 below.

$$gmx = \frac{IP - IN}{VIP - VIN} \quad (2)$$

Therefore, transconductance gmx can be represented as a difference of currents IN and IP divided by ΔV, as shown in Eqn.3.

$$gmx = \frac{(I - I2) - (I + I2)}{VIP - VIN} = -\frac{2 * I2}{\Delta V} \quad (3)$$

Where ΔV represents VIP−VIN.

Please refer to FIG. 2C. FIG. 2C is a circuit diagram of a conventional transconductor 30 formed with PMOS transistors according to the prior art. The transconductor 30 of FIG. 2C is identical to the transconductor 20 of FIG. 2A and FIG. 2B except that the NMOS transistors N1, N2, and N3 have been replaced with PMOS transistors P1, P2, and P3. In addition, parasitic capacitors CP3 and CP4 and current sources 32 and 34 of the transconductor 30 are all connected to a voltage source $V_{DD}$. Since the transconductor 30 operates in the same manner as the transconductor 20, additional explanation will not be given for the transconductor 30.

Please refer back to FIG. 1 and Eqn.1. As mentioned above, if the ratio of Vout to Vin is to be lowered, the transconductance gm1 of the transconductor 20 can be lowered, or the capacitance C of the capacitor C1 can be raised. Unfortunately, it is difficult to give the transconductor 20 a very low transconductance value gm1 since the parasitic capacitors CP1 and CP2 inherently exist on the transconductor 20, creating a zero and causing positive excess phase. This excess phase distorts the quality of the gm-C filter unit 10, and is even more serious in high Q or low frequency applications. Therefore, the only alternative is to raise the size of the capacitor C1.

SUMMARY OF INVENTION

It is therefore a primary objective of the claimed invention to provide a transconductor circuit for use in low frequency applications and having a lower transconductance in order to solve the above-mentioned problems.

According to the claimed invention, a transconductor circuit includes a first current source electrically connected to a first node of the circuit for supplying a first input current to the circuit; a second current source electrically connected to a second node of the circuit for supplying a second input current to the circuit; a first transistor having a first electrode electrically coupled to the first node, a control electrode electrically coupled to a first input voltage, and a second electrode connected to a third node, the third node being used for outputting a first output current from the circuit; a second transistor having a first electrode electrically coupled to the first node, a control electrode electrically coupled to the first input voltage, and a second electrode connected to a fourth node, the fourth node being used for outputting a second output current from the circuit; a third transistor having a first electrode electrically coupled to the second node, a control electrode electrically coupled to a second input voltage, and a second electrode connected to the fourth node; and a fourth transistor having a first electrode electrically coupled to the second node, a control electrode electrically coupled to the second input voltage, and a second electrode connected to the third node.

It is an advantage of the claimed invention that the transconductor circuit has a lower transconductance and does not introduce any additional poles, zeros, input capacitance, or parasitic capacitance into the transconductor circuit. Therefore, the claimed invention transconductor circuit is well suited for use in low frequency applications.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 3A:
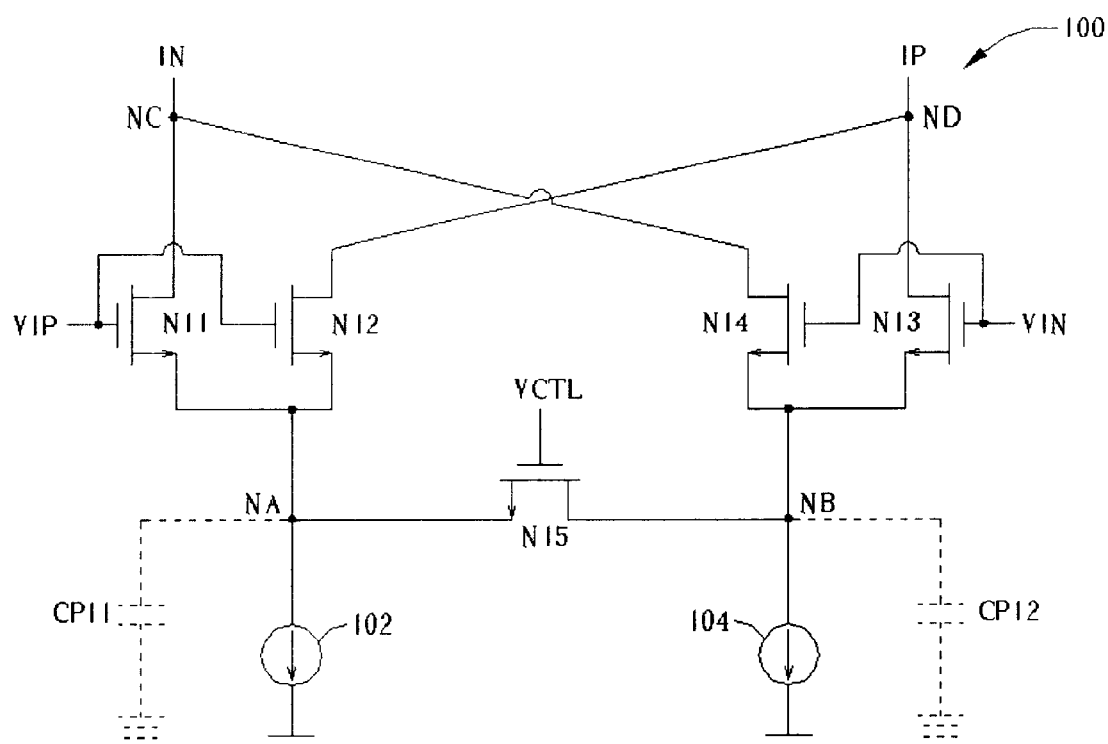
FIG. 3A is a circuit diagram of a transconductor formed with NMOS transistors according to the present invention.

Please refer to FIG. 3A. FIG. 3A is a circuit diagram of a transconductor 100 formed with NMOS transistors according to the present invention. The transconductor 100 contains first and second current sources 102 and 104, which provide current to the transconductor 100 at nodes NA and NB, respectively. Unlike the prior art, the present invention transconductor 100 contains four transistors N11, N12, N13, and N14 instead of the differential pair of transistors N1 and N2 used in the prior art transconductor 20. Gates of transistors N11 and N12 are each controlled by VIP, while gates of transistors N13 and N14 are each controlled by VIN. The sources of transistors N11 and N12 are connected to current source 102 at node NA and the sources of transistors N13 and N14 are connected to current source 104 at node NB.

A negative output current IN flows from the transconductor 100 at node NC, and a positive output current IP flows from the transconductor 100 at node ND. A drain of transistor N11 is connected to node NC, and a drain of transistor N12 is connected to node ND. Similarly, a drain of transistor N13 is connected to node ND, and a drain of transistor N14 is connected to node NC. Thus, transistors N11, N12, N13, and N14 are arranged in a cross-coupled shape.

The transconductor 100 further comprises a control transistor N15 connected between node NA and node NB. The control transistor N15 has a gate controlled by a control voltage VCTL.

Figure 2A:
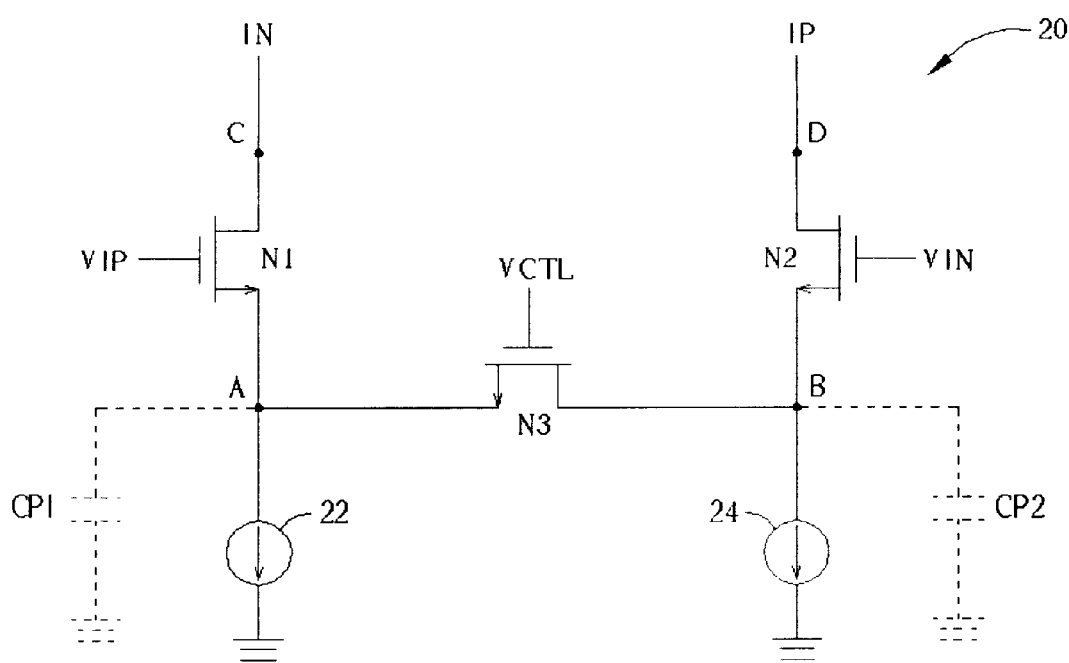
FIG. 2A is a circuit diagram of a conventional transconductor formed with NMOS transistors according to the prior art.
Figure 2B:
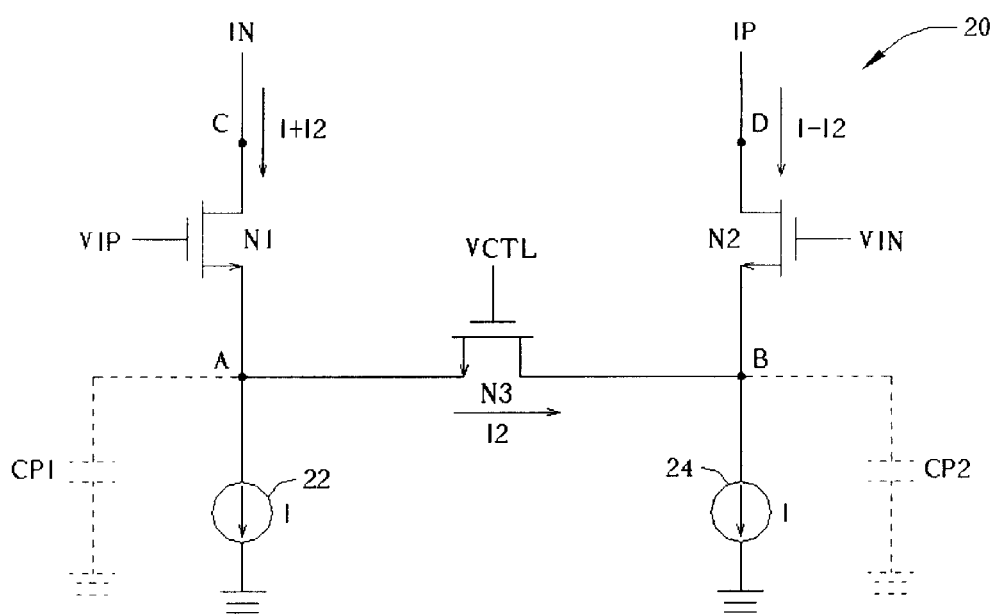
FIG. 2B is a circuit diagram showing current values in the transconductor of FIG. 2A.
Figure 2C:
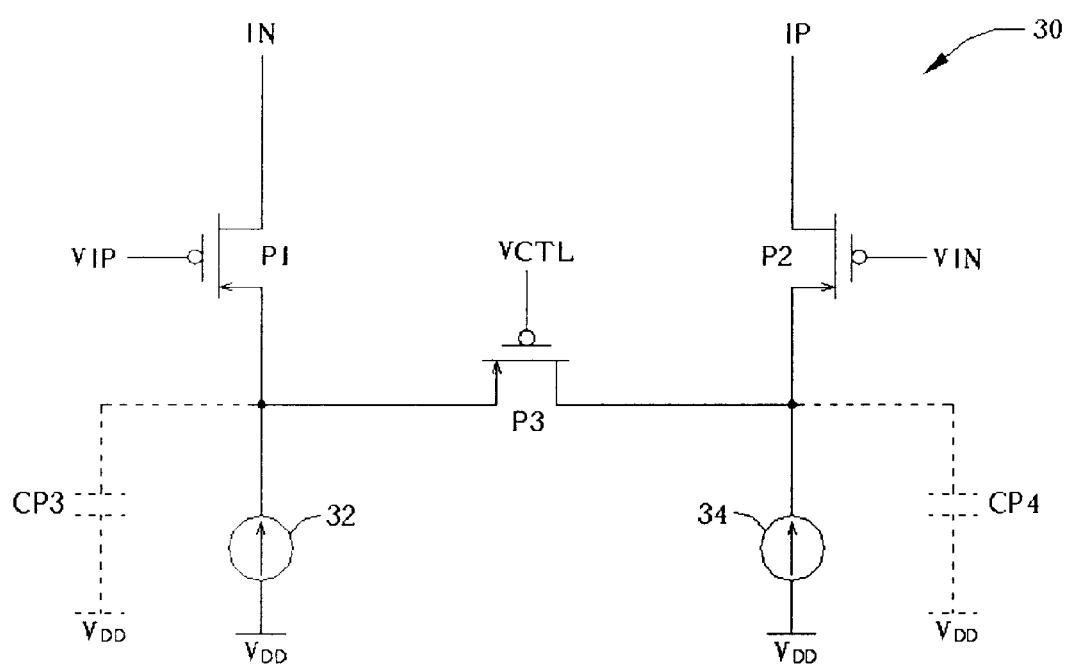
FIG. 2C is a circuit diagram of a conventional transconductor formed with PMOS transistors according to the prior art.

Unlike the prior art, transistors N11, N12, N13, and N14 do not all have the same width-to-length ratios. In a preferred embodiment of the present invention, the transistors N11, N12, N13, and N14 have the same length, but have two different widths. Specifically, transistors N11 and N13 have widths of W1 and transistors N12 and N14 have widths of W2. The widths W1 and W2 are chosen such that W1+W2= W, where W is the width of transistors N1 and N2 in FIG. 2A. The gates of transistors N11 and N12 are each controlled by the same voltage source, and the sources of each are connected to the same node. Therefore, transistors N11 and N12 together have properties similar to transistor N1 of FIG. 2A since the sum of the widths W1 and W2 of transistors N11 and N12 is equal to the width W of transistor N1. Likewise, transistors N13 and N14 together have properties similar to transistor N2 of FIG. 2A since the sum of the widths W1 and W2 of transistors N13 and N14 is equal to the width W of transistor N2.

Like the prior art, parasitic capacitors CP11 and CP12 inherently exist on the transconductor 100, and create an excess positive phase on the negative and positive output currents IN and IP output from the transconductor 100. In addition, an input capacitance is also associated with the transconductor 100. Since the pairs of transistors N11, N12 and N13, N14 have the same respective properties of single transistors N1 and N2 of the prior art, the parasitic and input capacitances have the same values in the present invention transconductor 100 as with the prior art transconductor 20 shown in FIG. 2A.

Figure 3B:
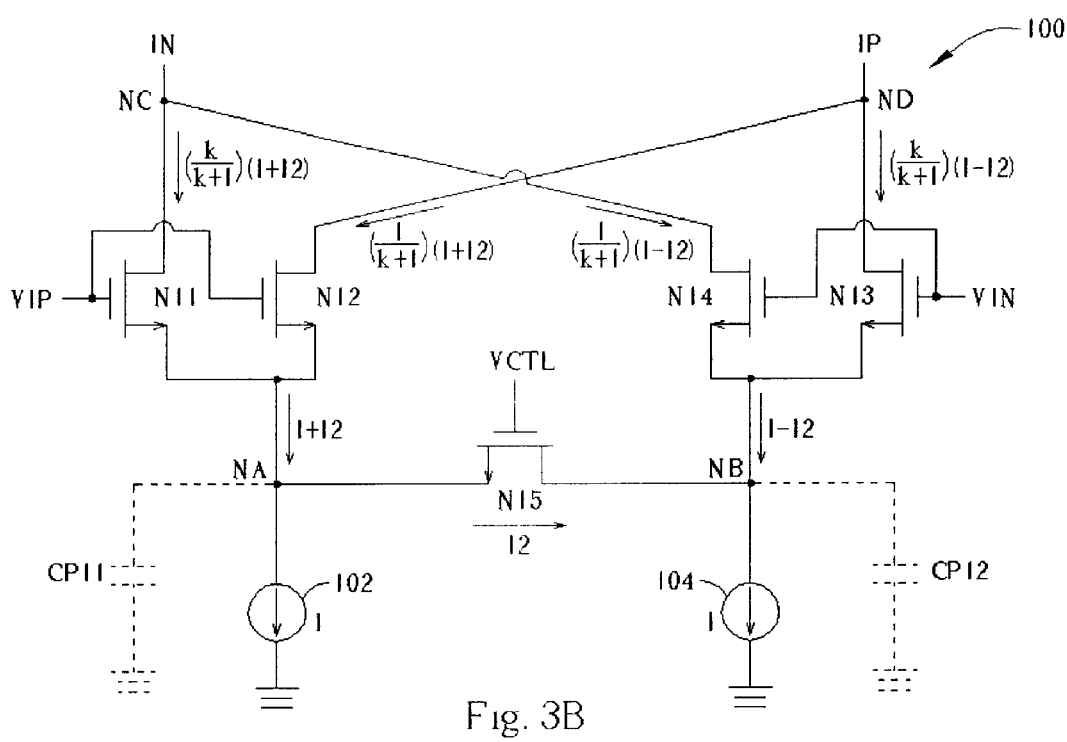
FIG. 3B is a circuit diagram showing current values in the transconductor of FIG. 3A.

Please refer to FIG. 3B. FIG. 3B is a circuit diagram showing current values in the transconductor 100 of FIG. 3A. The width W1 of transistors N11 and N13 and width W2 of transistors N12 and N14 are related to each other by a factor k, where k=W1/W2. Depending on the width of each transistor, a magnitude of current flowing through each transistor varies accordingly, as is shown in Eqn.4.

$$I = \mu C_{ox} \frac{W}{L} (V_{GS} - V_T)^2 \tag{4}$$

Where $\mu$ is the mobility of the carriers in the transistor, $C_{ox}$ is the gate capacitance per unit area, $V_{GS}$ is the gate-source voltage, and $V_T$ is the threshold voltage of the transistor.

Current I flows through the first current source 102 from node NA to ground and also travels through the second current source 104 from node NB to ground. As with the prior art, for simple current analysis, control transistor N15 can be modeled as a resistor with a current I2 flowing from node NA to node NB. Therefore, a current of I+I2 flows from the sources of transistors N11 and N12 to node NA. This current is split up, with a current of [k/(k+1)]*(I+I2) flowing through the transistor N11 from node NC to node NA and a current of [1/(k+1)]*(I+I2) flowing through the transistor N12 from node ND to node NA. On the other hand, a current of I-I2 flows from the sources of transistors N13 and N14 to node NB. This current is split up, with a current of [k/(k+1)]*(I-I2) flowing through the transistor N13 from node ND to node NB and a current of [1/(k+1)]*(I-I2) flowing through the transistor N14 from node NC to node NB.

The transconductance of the transconductor 100 will be defined as gmy. Based on Eqn.2, Eqns.5–7 will be used to calculate the transconductance gmy.

$$gmy = \frac{IP - IN}{VIP - VIN} \quad (5)$$

$$gmy = \frac{\left[\frac{1}{k+1}(I + I2) + \frac{k}{k+1}(I - I2)\right] - \left[\frac{k}{k+1}(I + I2) + \frac{1}{k+1}(I - I2)\right]}{\Delta V} \quad (6)$$

$$gmy = \frac{\frac{k-1}{k+1}(I - I2) - \frac{k-1}{k+1}(I + I2)}{\Delta V} = \frac{\frac{k-1}{k+1}(-2 * I2)}{\Delta V} \quad (7)$$

Then, by substituting with Eqn.3, Eqn.8 shows the present invention transconductance gmy in terms of the prior art transconductance gmx.

$$gmy = \frac{k-1}{k+1} * gmx \quad (8)$$

Analyzing Eqn.8 allows the significance of the present invention to be clearly seen. By choosing a value of k, such that k is greater than 1, the present invention transconductor 100 can have a lower transconductance than the transconductor 20 of the prior art. For example, suppose that W1=3*W/4 and W2=W/4. That is, the width of transistors N11 and N13 in the present invention transconductor 100 is three-fourths that of transistors N1 and N2 in the prior art transconductor 20, and the width of transistors N12 and N14 in the present invention transconductor 100 is one-fourth that of transistors N1 and N2 in the prior art transconductor 20. Since k=W1/W2, k=3 for this example. By substituting into Eqn.8, the transconductance gmy of the present invention is shown to be equal to one half of the transconductance gmx of the prior art.

Figure 3C:
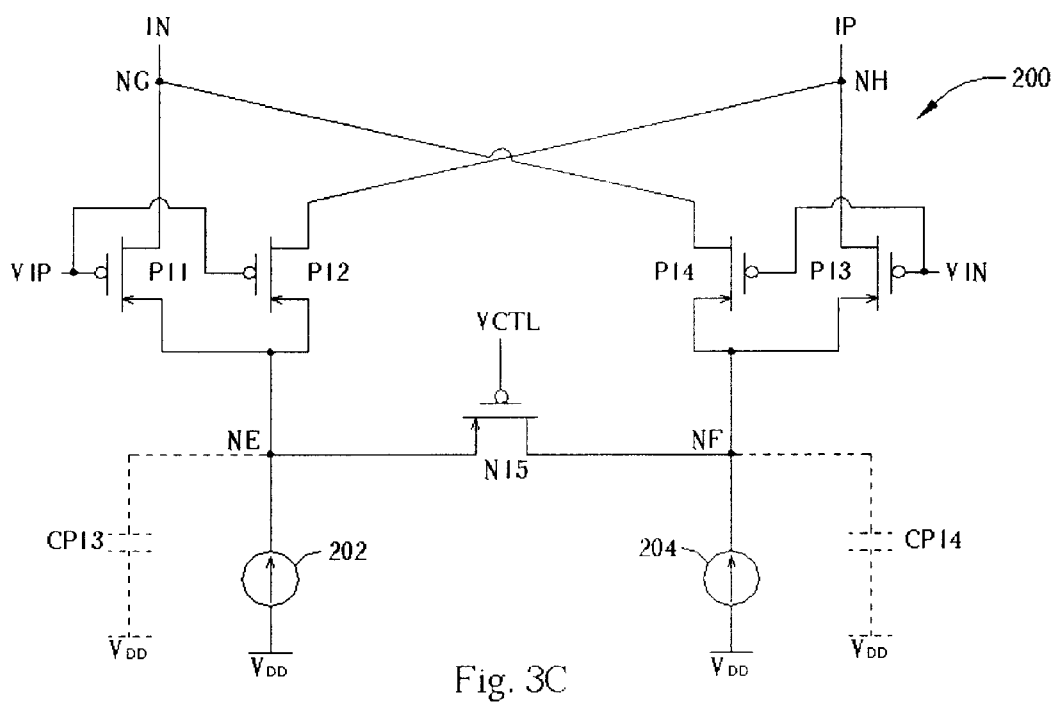
FIG. 3C is a circuit diagram of a transconductor formed with PMOS transistors according to the present invention.

Please refer to FIG. 3C. FIG. 3C is a circuit diagram of a transconductor 200 formed with PMOS transistors according to the present invention. The transconductor 200 of FIG. 3C is identical to the transconductor 100 of FIG. 3A and FIG. 3B except that the NMOS transistors N11–N15 have been replaced with PMOS transistors P11–P15. In addition, parasitic capacitors CP13 and CP14 and current sources 202 and 204 of the transconductor 30 are all connected to a voltage source $V_{DD}$. Since the transconductor 200 operates in the same manner as the transconductor 100, additional explanation will not be given for the transconductor 200.

Not only does the present invention transconductor 100 provide a transconductance that is a fraction of the prior art transconductor 20, but also no additional poles or zeroes are introduced with the present invention transconductor 100 as compared to the prior art transconductor 20. In fact, all other properties of the transconductor 100 will be the same as the transconductor 20 of the prior art since the only difference between them is each transistor having a width of W is replaced by two transistors with a total width of W. Therefore, the parasitic capacitance present in the present invention transconductor 100 will be equal to the parasitic capacitance present in the prior art transconductor 20. Furthermore, since the input capacitance is only dependent on the size of the input MOS transistors, input capacitance will be the same in the prior art transconductor 20 and the present invention transconductor 100 since the total widths of the transistors is equal.

Since the input capacitance of the present invention transconductor 100 is the same as the input capacitance of the prior art transconductor 20, no additional dummy transconductors will be needed to match the input capacitance of the transconductor 100 as compared to the prior art transconductor 20. In addition, all values such as the current I, the current I2, the total width of the transistors, and the length of the transistors are the same in the present invention transconductor 100 as in the prior art transconductor 20.

Figure 1:
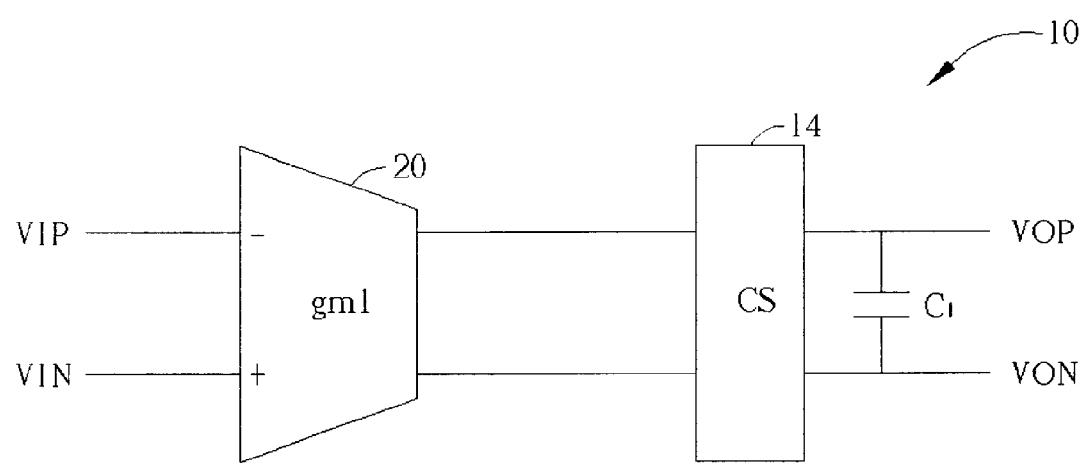
FIG. 1 is a block diagram of a gm-C filter unit according to the prior art.

Referring back to FIG. 1, if the ratio of Vout to Vin is to be lowered, the transconductance gm1 of the transconductor 20 can be lowered, or the capacitance C of the capacitor C1 can be raised. With the present invention transconductor 100, the transconductance can easily be lowered by a factor, thus avoiding the need to increase the size of the capacitor C1. Therefore, the present invention transconductor 100 allows the designer of an integrated circuit (IC) including a gm-C filter unit to save a great deal of area on the IC that would normally have to be used for forming a larger capacitor. The present invention is particularly useful in low frequency applications, where a low transconductance is desirable.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A transconductor circuit comprising:
   a first current source electrically connected to a first node of the circuit for supplying a first input current to the circuit;
   a second current source electrically connected to a second node of the circuit for supplying a second input current to the circuit;
   a first transistor having a first electrode electrically coupled to the first node, a control electrode electrically coupled to a first input voltage, and a second electrode connected to a third node, the third node being used for outputting a first output current from the circuit;
   a second transistor having a first electrode electrically coupled to the first node, a control electrode electrically coupled to the first input voltage, and a second electrode connected to a fourth node, the fourth node being used for outputting a second output current from the circuit;
   a third transistor having a first electrode electrically coupled to the second node, a control electrode electrically coupled to a second input voltage, and a second electrode connected to the fourth node; and
   a fourth transistor having a first electrode electrically coupled to the second node, a control electrode electrically coupled to the second input voltage, and a second electrode connected to the third node.

2. The transconductor circuit of claim 1 further comprising a control transistor having a first electrode electrically coupled to the first node, a control electrode electrically coupled to a control voltage, and a second electrode connected to the second node.

3. The transconductor circuit of claim 1 wherein the first and second input currents are equal.

4. The transconductor circuit of claim 1 wherein the first and third transistors have identical width-to-length ratios.

5. The transconductor circuit of claim 4 wherein the second and fourth transistors have identical width-to-length ratios.

6. The transconductor circuit of claim 1 wherein the first and third transistors have identical widths and lengths and the second and fourth transistors have identical widths and lengths.

7. The transconductor circuit of claim 6 wherein the widths of the first and third transistors are greater than the widths of the second and fourth transistors according to a predetermined ratio.

8. The transconductor circuit of claim 1 wherein the first, second, third, and fourth transistors are all NMOS transistors.

9. The transconductor circuit of claim 1 wherein the first, second, third, and fourth transistors are all PMOS transistors.

10. The transconductor circuit of claim 1 wherein the first, second, third, and fourth transistors are MOS transistors; the first electrodes of the first, second, third, and fourth transistors are sources of the MOS transistors; the control electrodes of the first, second, third, and fourth transistors are gates of the MOS transistors; and the second electrodes of the first, second, third, and fourth transistors are drains of the MOS transistors.

11. A method of forming a transconductor circuit, the method comprising:

providing a first current source electrically connected to a first node of the circuit for supplying a first input current to the circuit;

providing a second current source electrically connected to a second node of the circuit for supplying a second input current to the circuit;

providing first and third transistors having a first width-to-length ratio;

providing second and fourth transistors having a second width-to-length ratio;

controlling control electrodes of the first and second transistors with a first input voltage;

controlling control electrodes of the third and fourth transistors with a second input voltage;

electrically connecting a first electrode of the first and second transistors to the first node of the circuit, electrically connecting a second electrode of the first transistor to a third node of the circuit, and electrically connecting a second electrode of the second transistor to a fourth node of the circuit; and electrically connecting a first electrode of the third and fourth transistors to the second node of the circuit, electrically connecting a second electrode of the third transistor to the fourth node of the circuit, and electrically connecting a second electrode of the fourth transistor to the third node of the circuit;

wherein the third node is used for outputting a first output current from the circuit and the fourth node is used for outputting a second output current from the circuit.

12. The method of claim 11 further comprising providing a control transistor having a first electrode electrically coupled to the first node, a control electrode electrically coupled to a control voltage, and a second electrode connected to the second node.

13. The method of claim 11 wherein the first and second input currents are equal.

14. The method of claim 11 wherein the first and third transistors have identical widths and lengths and the second and fourth transistors have identical widths and lengths.

15. The method of claim 14 wherein the widths of the first and third transistors are greater than the widths of the second and fourth transistors according to a predetermined ratio.

16. The method of claim 11 wherein the first, second, third, and fourth transistors are all NMOS transistors.

17. The method of claim 11 wherein the first, second, third, and fourth transistors are all PMOS transistors.

18. The method of claim 11 wherein the first, second, third, and fourth transistors are MOS transistors; the first electrodes of the first, second, third, and fourth transistors are sources of the MOS transistors; the control electrodes of the first, second, third, and fourth transistors are gates of the MOS transistors; and the second electrodes of the first, second, third, and fourth transistors are drains of the MOS transistors.

19. A transconductor circuit for implementing the method of claim 11.

* * * * *